(12) United States Patent
Tadakuma et al.

(10) Patent No.: US 12,087,739 B2
(45) Date of Patent: Sep. 10, 2024

(54) SEMICONDUCTOR DEVICE

(71) Applicant: Mitsubishi Electric Corporation, Tokyo (JP)

(72) Inventors: Toshiya Tadakuma, Tokyo (JP); Shin Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 419 days.

(21) Appl. No.: 17/588,967

(22) Filed: Jan. 31, 2022

(65) Prior Publication Data
US 2023/0017535 A1 Jan. 19, 2023

(30) Foreign Application Priority Data
Jul. 15, 2021 (JP) .................. 2021-117289

(51) Int. Cl.
*H01L 23/498* (2006.01)
*H01L 23/00* (2006.01)
*H01L 25/07* (2006.01)
*H01L 25/18* (2023.01)
*H02P 27/06* (2006.01)

(52) U.S. Cl.
CPC ...... *H01L 25/072* (2013.01); *H01L 23/49844* (2013.01); *H01L 24/48* (2013.01); *H01L 25/18* (2013.01); *H01L 2224/48139* (2013.01); *H02P 27/06* (2013.01)

(58) Field of Classification Search
CPC ..... H01L 23/00; H01L 23/495; H01L 23/498; H01L 23/49562; H01L 23/49575; H01L 23/49844; H01L 25/07; H01L 25/18; H01L 24/45; H01L 24/48; H01L 2224/48139; H01L 2224/45124; H01L 2224/45144; H01L 2224/48247; H01L 2924/181; H01L 2924/00012; H01L 2924/00014; H01L 2924/02005
USPC ......................................... 257/668
See application file for complete search history.

(56) References Cited

U.S. PATENT DOCUMENTS

| | | | | |
|---|---|---|---|---|
| 2005/0168491 A1* | 8/2005 | Takahara | ............ | G09G 3/3241 345/690 |
| 2010/0277401 A1* | 11/2010 | Takahara | ............... | G09G 3/006 345/76 |
| 2014/0069532 A1* | 3/2014 | Obata | .................. | G06F 3/046 137/554 |

FOREIGN PATENT DOCUMENTS

JP 2011-096696 A 5/2011

* cited by examiner

*Primary Examiner* — Chuong A Luu
(74) *Attorney, Agent, or Firm* — Studebaker & Brackett PC (57) ABSTRACT

A semiconductor device includes: a semiconductor module including a switching device, a first wiring connected to the switching device, a second wiring positioned adjacent to the first wiring and generating induced electromotive force according to a change in an electric current flowing in the first wiring, and a sealing material sealing the switching device, the first wiring and the second wiring, wherein both of one end and the other end of the second wiring are exposed from the sealing material; a substrate including a GND electrode connected to the one end and on which the semiconductor module is mounted; and a diode rectifying the induced electromotive force output from the other end.

10 Claims, 9 Drawing Sheets

SEMICONDUCTOR DEVICE

BACKGROUND OF THE INVENTION

Field

The present disclosure relates to a semiconductor device.

Background

As a transfer mold type intelligent power module, there is a power module including a terminal having a floating potential (see, for example, FIG. 1 of JP 2011-96696 A).

SUMMARY

In the power module of the related art, only one end of the floating terminal is exposed from mold resin in order to be connected to the outside. In such a terminal, a micro power supply voltage cannot be generated.

The present disclosure has been made in order to solve the problem described above, and an object of the present disclosure is to obtain a semiconductor device that can generate a micro power supply voltage.

A semiconductor device according to the present disclosure includes: a semiconductor module including a switching device, a first wiring connected to the switching device, a second wiring positioned adjacent to the first wiring and generating induced electromotive force according to a change in an electric current flowing in the first wiring, and a sealing material sealing the switching device, the first wiring and the second wiring, wherein both of one end and the other end of the second wiring are exposed from the sealing material; a substrate including a GND electrode connected to the one end and on which the semiconductor module is mounted; and a diode rectifying the induced electromotive force output from the other end.

In the present disclosure, in the semiconductor module, the second wiring is positioned adjacent to the first wiring connected to the switching device and generates the induced electromotive force according to the change in the electric current flowing in the first wiring. Both of one end and the other end of the second wiring are exposed from the sealing material. The GND electrode of the substrate is connected to one end of the second wiring. The diode rectifies the induced electromotive force output from the other end of the second wiring. Consequently, a micro power supply voltage can be generated.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figures 1, 2:
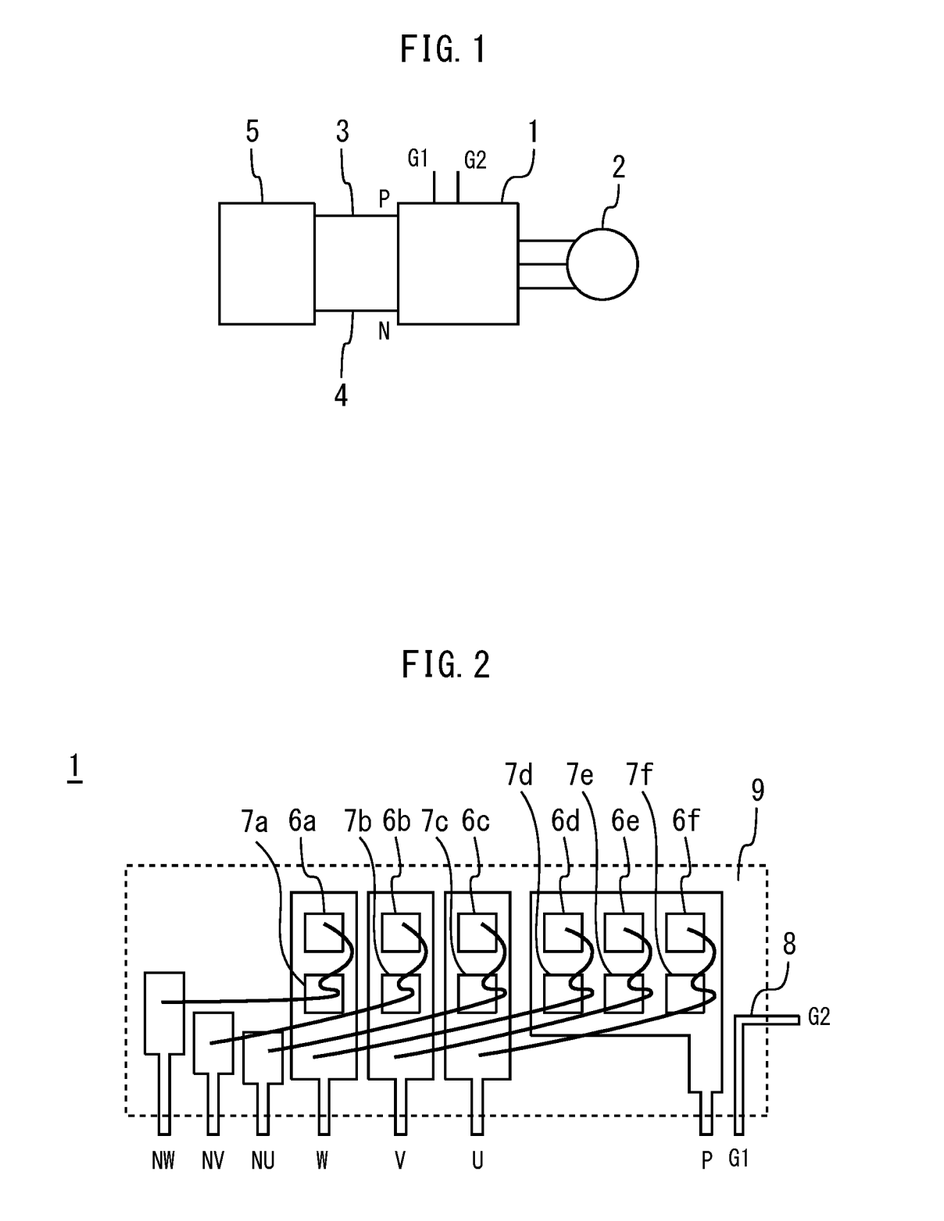
FIG. 1 is a diagram illustrating a semiconductor device according to a first embodiment.
FIG. 2 is a plan view illustrating a semiconductor module according to the first embodiment.

FIG. 1 is a diagram illustrating a semiconductor device according to a first embodiment. A semiconductor module 1 is a three-phase inverter that drives a motor 2. A P terminal and an N terminal of the semiconductor module 1 are connected to a smoothing capacitor 5 via DC link wirings 3 and 4.

FIG. 2 is a plan view illustrating a semiconductor module according to the first embodiment. Switching devices 6a to 6f are IGBTs, MOSFETs, or the like. The switching devices 6a to 6c and diodes 7a to 7c are respectively mounted on a W terminal, a V terminal, and a U terminal. The switching devices 6d to 6f and diodes 7d to 7f are mounted on the P terminal. An NW terminal, an NV terminal, an NU terminal, the W terminal, the V terminal, the U terminal, and the P terminal are made of flat plates of copper or the like.

Back electrodes of the switching devices 6a to 6c and back electrodes of the diodes 7a to 7c are respectively connected to the W terminal, the V terminal, and the U terminal by solder or the like. Back electrodes of the switching devices 6d to 6f and back electrodes of the diodes 7d to 7f are connected to the P terminal by solder or the like. Upper-surface electrodes of the switching devices 6a to 6f are respectively wire-connected to upper-surface electrodes of the diodes 7a to 7f. The upper-surface electrodes of the diodes 7a to 7f are respectively wire-connected to the NW terminal, the NV terminal, the NU terminal, the W terminal, the V terminal, and the U terminal. The wires are made of Au or Al.

A wiring 8 is positioned adjacent to a linear wiring portion of the P terminal without being in contact with the wiring portion. A sealing material 9 seals the switching devices 6a to 6f, the diodes 7a to 7f, the terminals such as the P terminal, and the wiring 8. The sealing material 9 is transfer resin such as epoxy resin, gel such as silicone gel, or the like. The P terminal having high voltage and the wiring 8 having low voltage are positioned as a short spatial distance while securing insulation in the sealing material 9. One end portions of the NW terminal, the NV terminal, the NU terminal, the W terminal, the V terminal, the U terminal, and the P terminal are exposed from the sealing material 9. Both of an end portion G1 and an end portion G2 of the wiring 8 are exposed from the sealing material 9.

When the switching devices 6d to 6f are turned on, an electric current flows to the P terminal. A magnetic flux is generated around the P terminal and affects the wiring 8 positioned adjacent to the P terminal. A change per unit time (di/dt) occurs in an electric current flowing in the P terminal by switching the switching devices 6d to 6f. The wiring 8 generates, with mutual induction, an induced electromotive force according to the change in the electric current flowing in the P terminal. Mutual inductance is determined by a degree of closeness of the P terminal and the wiring 8.

Figure 3:
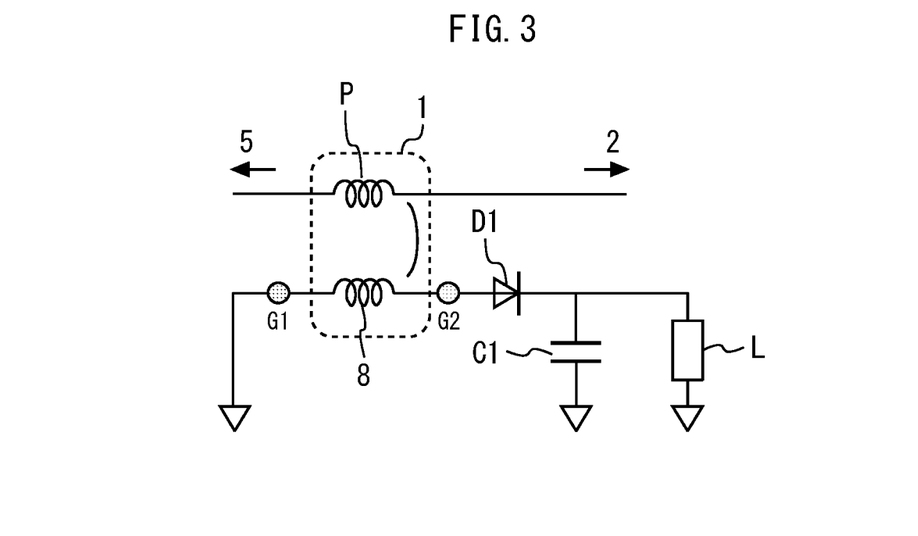
FIG. 3 is a circuit diagram of the semiconductor device according to the first embodiment.
Figure 4:
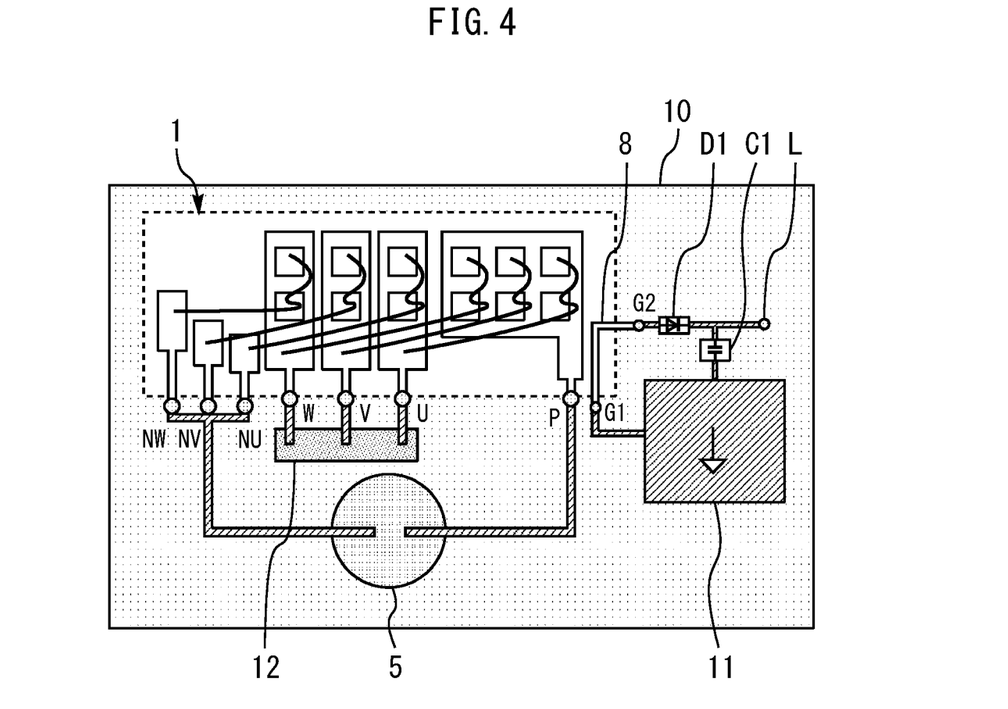
FIG. 4 is a plan view illustrating the semiconductor device according to the first embodiment.

FIG. 3 is a circuit diagram of the semiconductor device according to the first embodiment. FIG. 4 is a plan view illustrating the semiconductor device according to the first embodiment. The semiconductor module 1 and the smoothing capacitor 5 are mounted on a substrate 10. The substrate 10 includes the GND electrode 11. The NW terminal, the NV terminal, and the NU terminal are connected to one end of the smoothing capacitor 5 by wirings on the substrate 10. The P terminal is connected to the other end of the smoothing capacitor 5. The W terminal, the V terminal, and the U terminal are drawn out to an output terminal block 12 for connecting the W terminal, the V terminal, and the U terminal to the motor 2.

The end portion of the P terminal and the end portion G1 of the wiring 8 are exposed from the same side surface of the sealing material 9. The end portion G2 of the wiring 8 is exposed from another side surface of the sealing material 9. Therefore, the end portion G1 of the wiring 8 is positioned closer to the end portion of the P terminal compared with the end portion G2. Note that the end portion G1 and the end portion G2 of the wiring 8 may be exposed from the same side surface of the sealing material 9.

The end portion G1 of the wiring 8 is connected to the GND electrode 11 of the substrate 10. An anode of a diode D1 is connected to the end portion G2 of the wiring 8. A cathode of the diode D1 is connected to a load L. A capacitor C1 is connected between the cathode of the diode D1 and the GND electrode 11. The diode D1 rectifies an induced electromotive force output from the end portion G2 of the wiring 8. The capacitor C1 accumulates output power of the diode D1. The electric power accumulated in the capacitor C1 is supplied to the load L.

The electric power generated in this way can be used to, for example, generate a gate voltage for driving the switching devices 6a to 6f. A power module such as DIPIPM in which a switching device and an IC are integrally formed can use the electric power as a power supply voltage for activating the IC. Alternatively, the electric power can also be used as a power supply of external equipment such as an IC or an LED.

As explained above, in this embodiment, in the semiconductor module 1, the wiring 8 is positioned adjacent to the P terminal connected to the switching devices 6d to 6f and generates the induced electromotive force according to the change in the electric current flowing in the P terminal. Both of one end and the other end of the wiring 8 are exposed from the sealing material 9. The GND electrode 11 of the substrate 10 is connected to one end of the wiring 8. The diode D1 rectifies the induced electromotive force output from the other end. Consequently, a micro power supply voltage can be generated.

Figure 5:
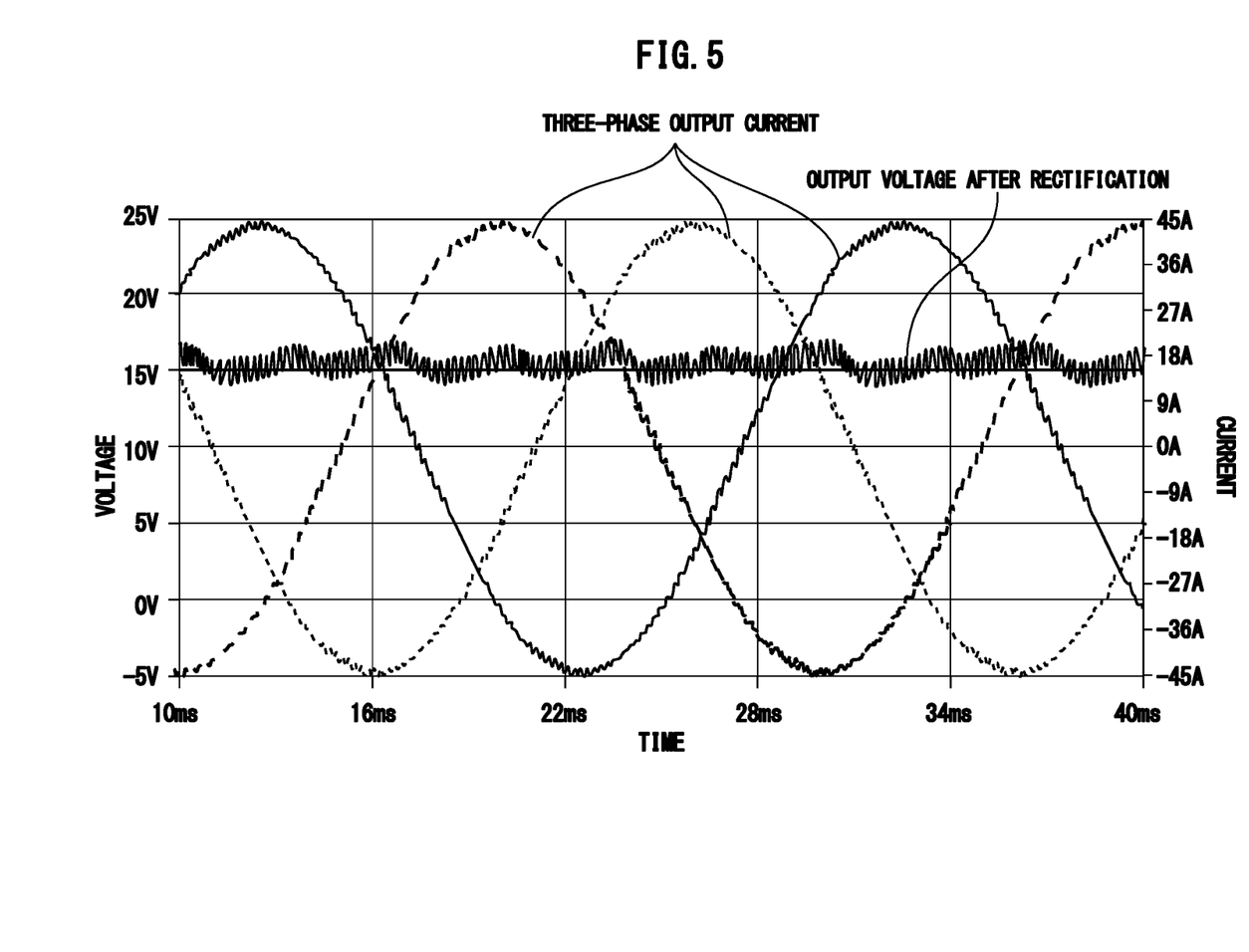
FIG. 5 is a diagram illustrating a three-phase output current to a motor and an output voltage after rectification by a diode.

FIG. 5 is a diagram illustrating a three-phase output current to a motor and an output voltage after rectification by a diode. For example, when the inductance of the P terminal is 1 uH, the inductance of the wiring 8 is 1 uH, and a coupling coefficient is 0.9, a micro power supply voltage of 15 V in average can be generated.

Figure 6:
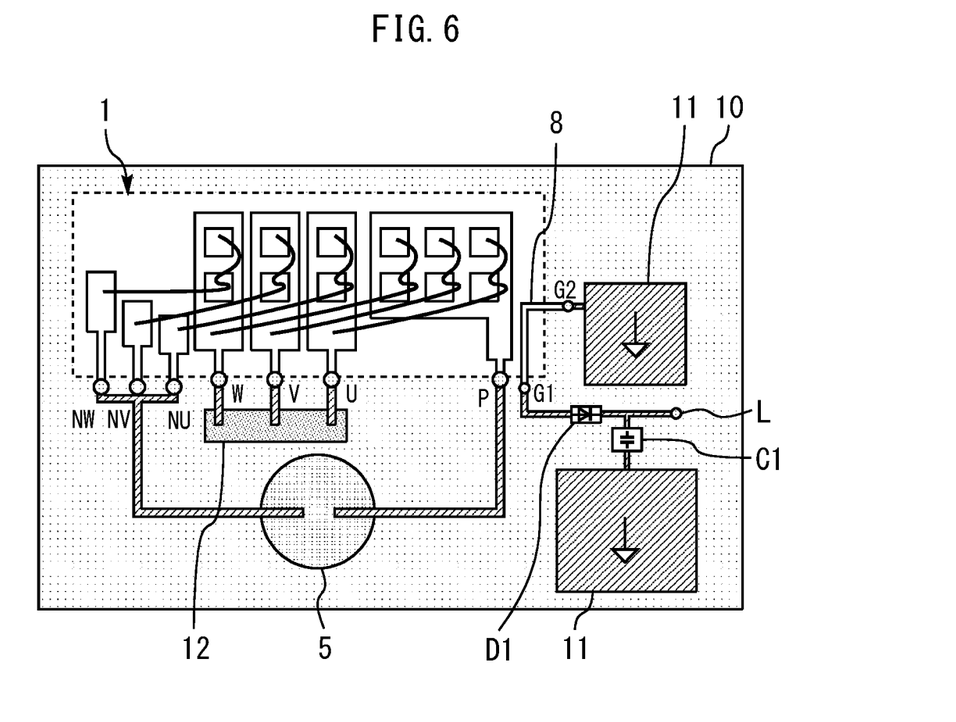
FIG. 6 is a diagram illustrating a modification of the semiconductor device according to the first embodiment.

FIG. 6 is a diagram illustrating a modification of the semiconductor device according to the first embodiment. Conversely from the first embodiment, the GND electrode 11 is connected to the end portion G2 of the wiring 8 and the diode D1 is connected to the end portion G1 of the wiring 8. Since the wiring 8 generates a micro power supply voltage using a temporal change in an electric current at a turn-on or turn-off time, even if the GND electrode 11 and the diode D1 are connected to the wiring 8 conversely to the first embodiment, a voltage can be generated if only the direction of the diode D1 is suitable.

Second Embodiment

Figure 7:
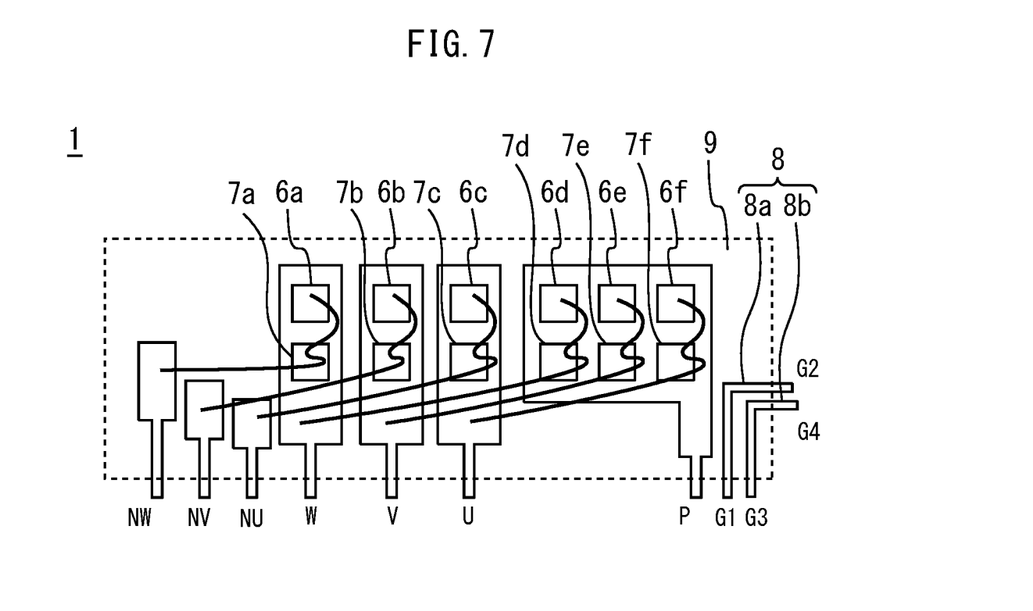
FIG. 7 is a diagram illustrating a semiconductor module according to a second embodiment.

FIG. 7 is a diagram illustrating a semiconductor module according to a second embodiment. Components other than the semiconductor module 1 are the same as the components in the first embodiment. The wiring 8 includes two or more wirings 8a and 8b having different distances from the P terminal. The end portion G1 of the wiring 8a is connected to the GND electrode 11 and the end portion G2 of the wiring 8 is connected to the anode of the diode D1. Similarly, an end portion G3 of the wiring 8b is connected to the GND electrode 11 and an end portion G4 of the wiring 8b is connected to an anode of another diode.

The wiring 8a is the closest to the P terminal and the wiring 8b is the second closest to the P terminal. If the distance from the P terminal is different, mutual inductance changes. Therefore, the mutual inductance of the wiring 8a is the largest and the mutual inductance of the wiring 8b is the second largest. Accordingly, a type of a micro power supply voltage can be changed in such a manner that a voltage generated by the wiring 8a is 15 V and a voltage generated by the wiring 8b is 5 V. That is, as many micro power supply voltages as the number of wirings can be generated.

Third Embodiment

Figure 8:
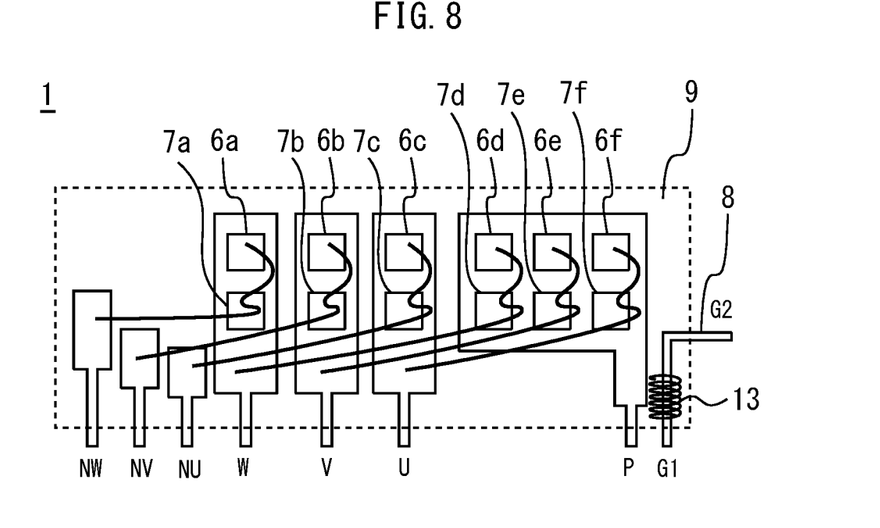
FIG. 8 is a diagram illustrating a semiconductor module according to a third embodiment.

FIG. 8 is a diagram illustrating a semiconductor module according to a third embodiment. Components other than the semiconductor module 1 are the same as the components in the first embodiment. The wiring 8 includes an inductor 13. An interlinkage flux can be adjusted according to switching speed (di/dt) of the switching devices 6d to 6f and the number of turns of the inductor 13. An induced electromotive force can be adjusted to a desired voltage. The other components and effects are the same as the components and the effects in the first embodiment.

Fourth Embodiment

Figure 9:
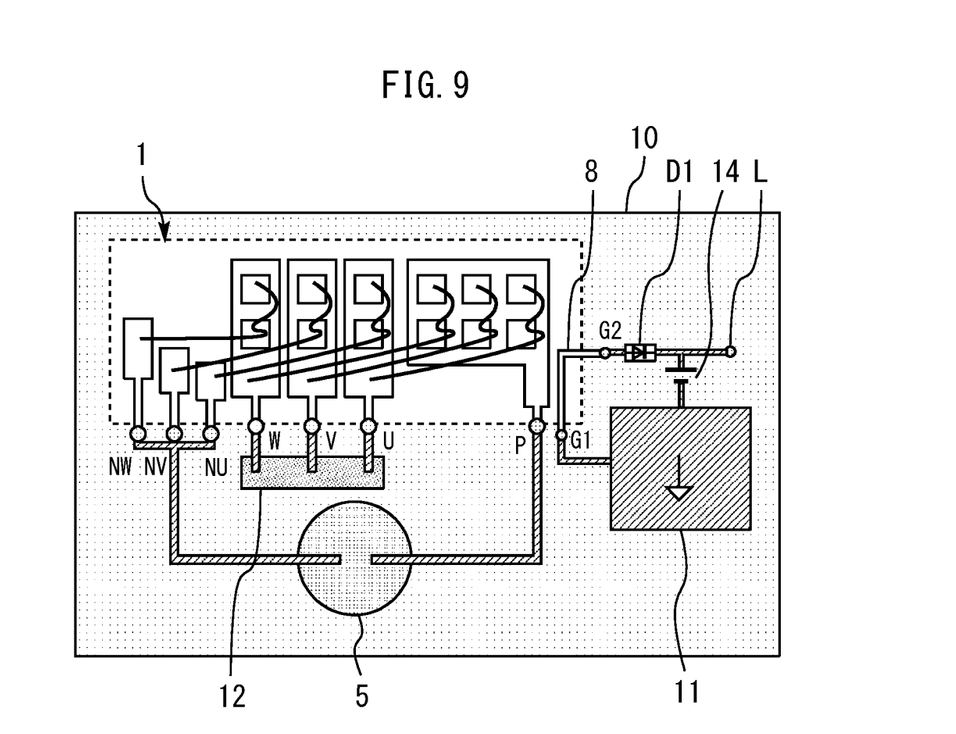
FIG. 9 is a diagram illustrating a semiconductor device according to a fourth embodiment.

FIG. 9 is a diagram illustrating a semiconductor device according to a fourth embodiment. In this embodiment, the capacitor C1 for charging in the first embodiment is replaced with a rechargeable battery 14. The rechargeable battery 14 is a recyclable battery such as a lithium ion battery or a solid state battery. An induced electromotive force generated by the wiring 8 of the semiconductor module 1 can be charged and used by the rechargeable battery 14. Since initial charging is unnecessary, a power supply circuit for rising start is unnecessary and a DC/DC circuit for a control power supply is unnecessary.

Fifth Embodiment

Figure 10:
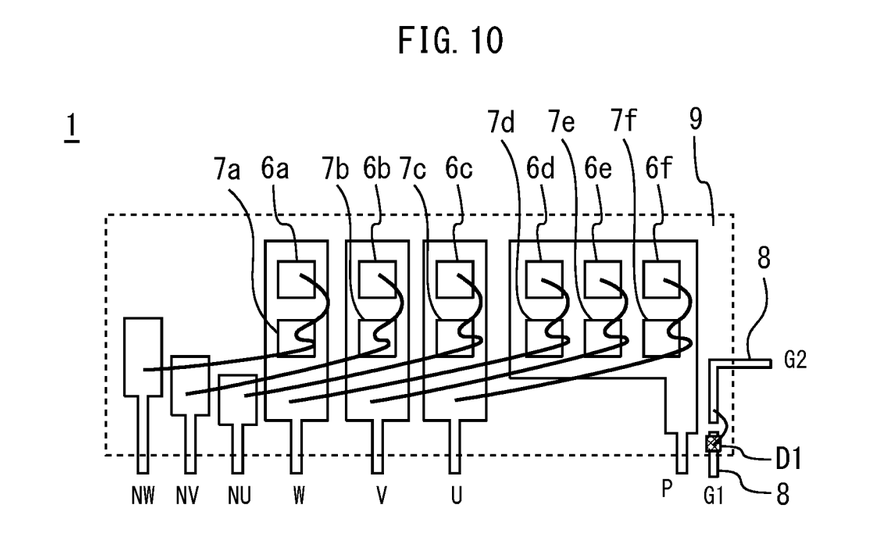
FIG. 10 is a diagram illustrating a semiconductor module according to a fifth embodiment.

FIG. 10 is a diagram illustrating a semiconductor module according to a fifth embodiment. The diode D1 for backflow prevention is provided on the inside of the semiconductor module 1. The wiring 8 is divided into two wirings on the inside of the semiconductor module 1. One wiring is connected to a lower-surface electrode of the diode D1 and the other wiring is wire-connected to an upper-surface electrode of the diode D1. Since the diode D1 is provided on the module inside, the number of components externally attached to the semiconductor module 1 and the area of the components can be reduced. It is possible to save a space of a circuit. The other components and effects are the same as the components and the effects in the first embodiment.

Sixth Embodiment

Figure 11:
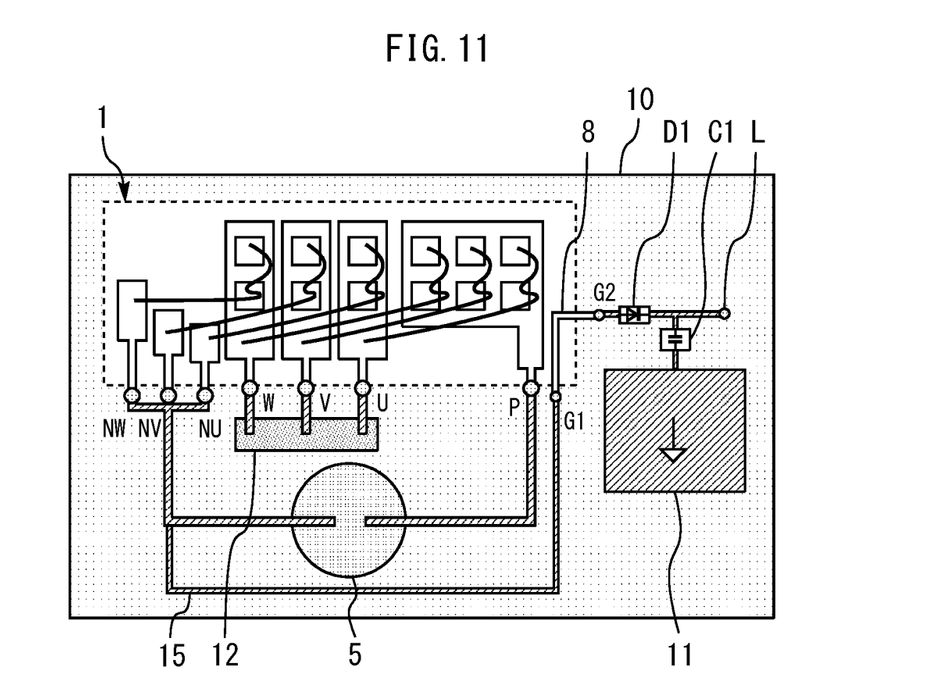
FIG. 11 is a diagram illustrating a semiconductor device according to a sixth embodiment.

FIG. 11 is a diagram illustrating a semiconductor device according to a sixth embodiment. In the first embodiment, the end portion G1 of the wiring 8 is connected to the GND electrode 11 on a control side to which the capacitor C1 is connected. However, in this embodiment, the end portion G1 of the wiring 8 is connected to a GND electrode 15 on a power side to which the negative electrode terminals NW, NV, and NU of the semiconductor module 1 are connected. In this way, the wiring 8 may be connected to either the GND electrode 11 on the control side or the GND electrode 15 on the power side. Therefore, flexibility of design is high.

Seventh Embodiment

Figure 12:
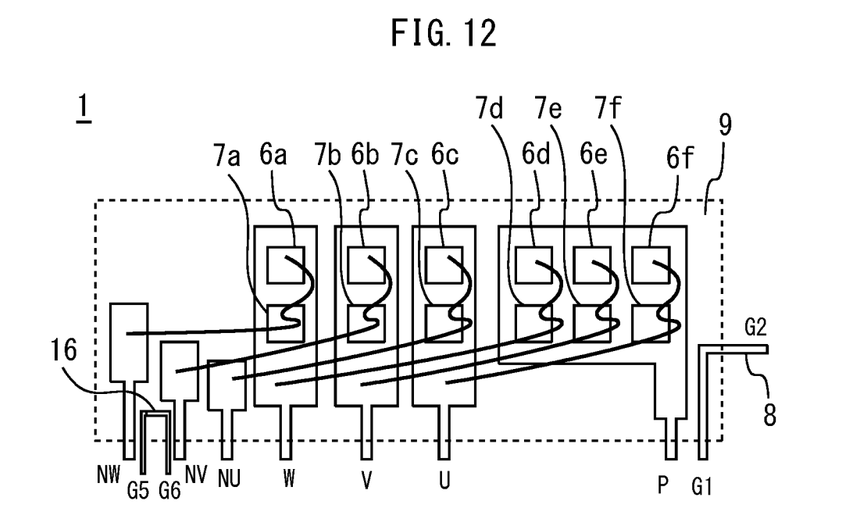
FIG. 12 is a diagram illustrating a semiconductor module according to a seventh embodiment.
Figure 13:
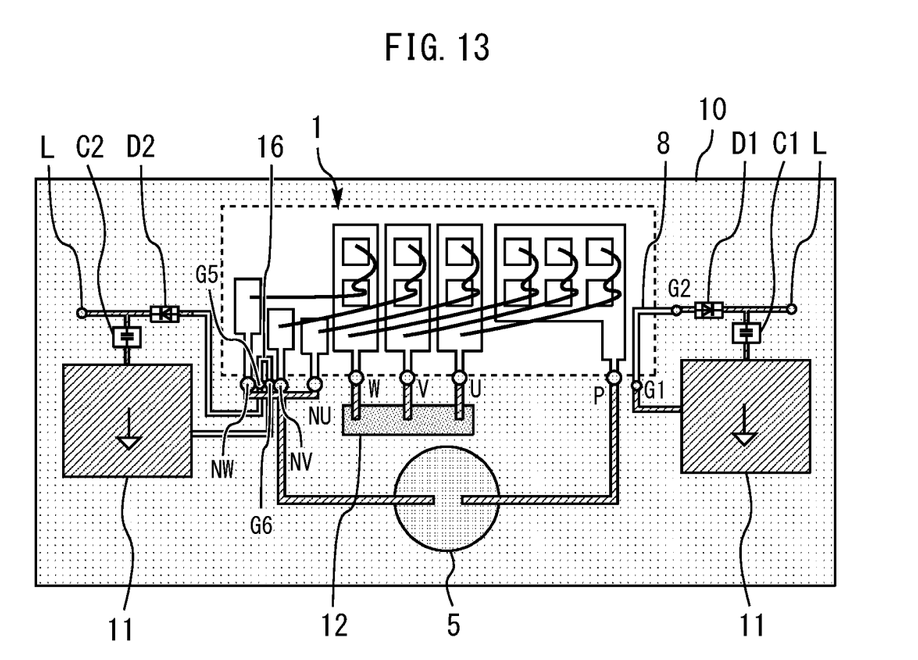
FIG. 13 is a diagram illustrating a semiconductor device according to the seventh embodiment.

FIG. 12 is a diagram illustrating a semiconductor module according to a seventh embodiment. FIG. 13 is a diagram illustrating a semiconductor device according to the seventh embodiment. A wiring 16 is positioned in a U shape between the NW terminal and the NV terminal. Both of an end portion G5 and an end portion G6 of the wiring 16 are exposed from the sealing material 9. The wiring 16 generates an induced electromotive force according to a change in an electric current flowing in the NW terminal and the NV terminal. As in the wiring 8, the end portion G6 of the wiring 16 is connected to the GND electrode 11 and the end portion G5 of the wiring 16 is connected to an anode of a diode D2. A capacitor C2 accumulates output power of the diode D2.

The wiring 16 generates an induced electromotive force using a temporal change in an electric current at an ON time of the NW terminal and a temporal change in an electric current at an OFF time of the NV terminal or a temporal change in an electric current at an OFF time of the NW terminal and a temporal change in an electric current at an ON time of the NV terminal.

Figure 14:
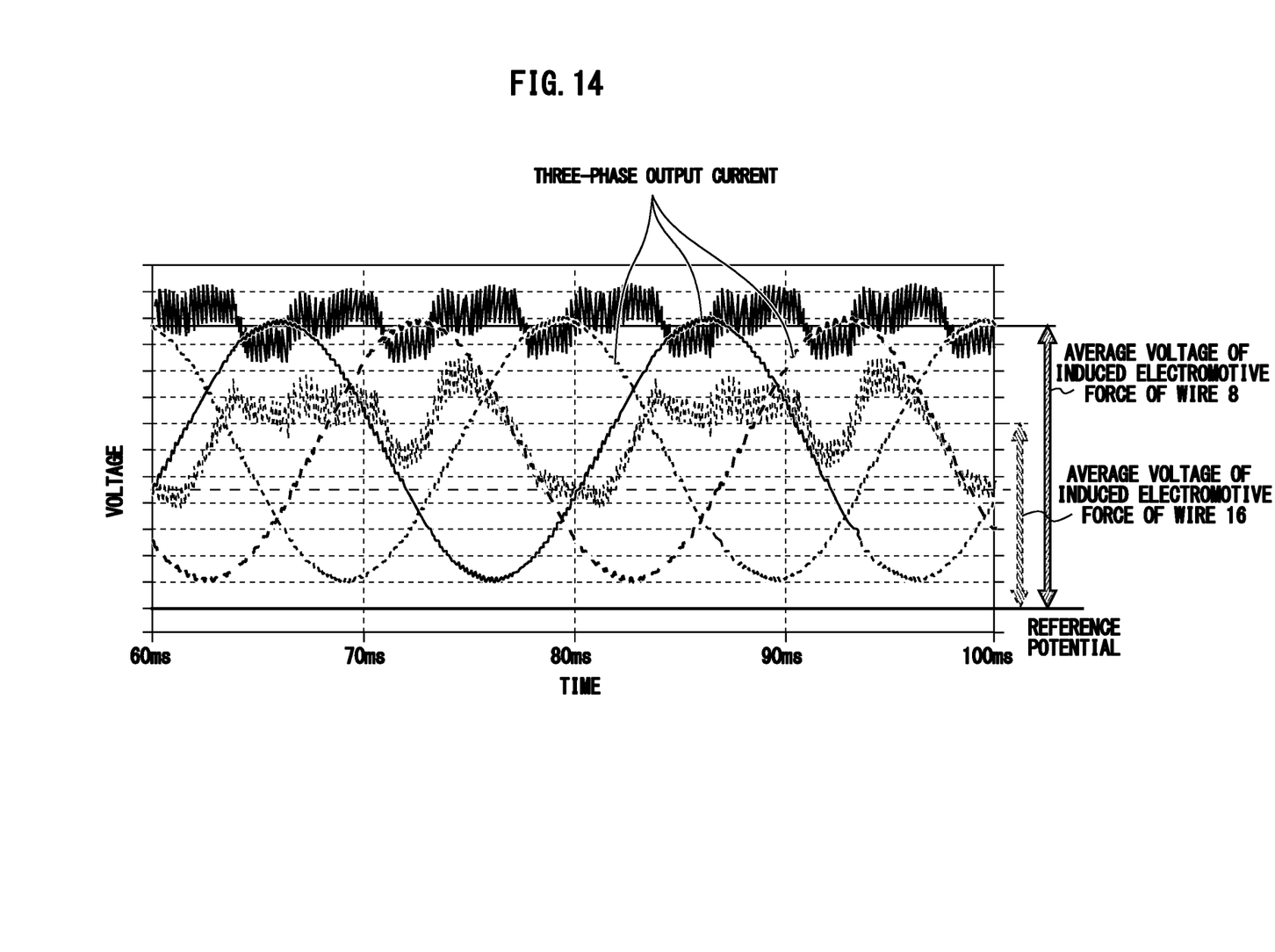
FIG. 14 is a diagram illustrating a profile of a micro power supply voltage generated by the semiconductor module according to the seventh embodiment.

FIG. 14 is a diagram illustrating a profile of a micro power supply voltage generated by the semiconductor module according to the seventh embodiment. The wiring 8 adjacent to the P terminal generates a micro voltage using temporal changes of electric currents at turn-on or turn-off times in all of a U phase, a V phase, and a W phase of three-phase sine wave modulation. On the other hand, the wiring 16 generates an induced electromotive force using only two among three N terminals. Therefore, unevenness is caused in the induced electromotive force of the wiring 16 by potential fluctuation. Accordingly, an average voltage of the induced electromotive force of the wiring 16 is ⅔ of an average voltage of the induced electromotive force of the wiring 8. The other components and effects are the same as the components and the effects in the first embodiment.

Figure 15:
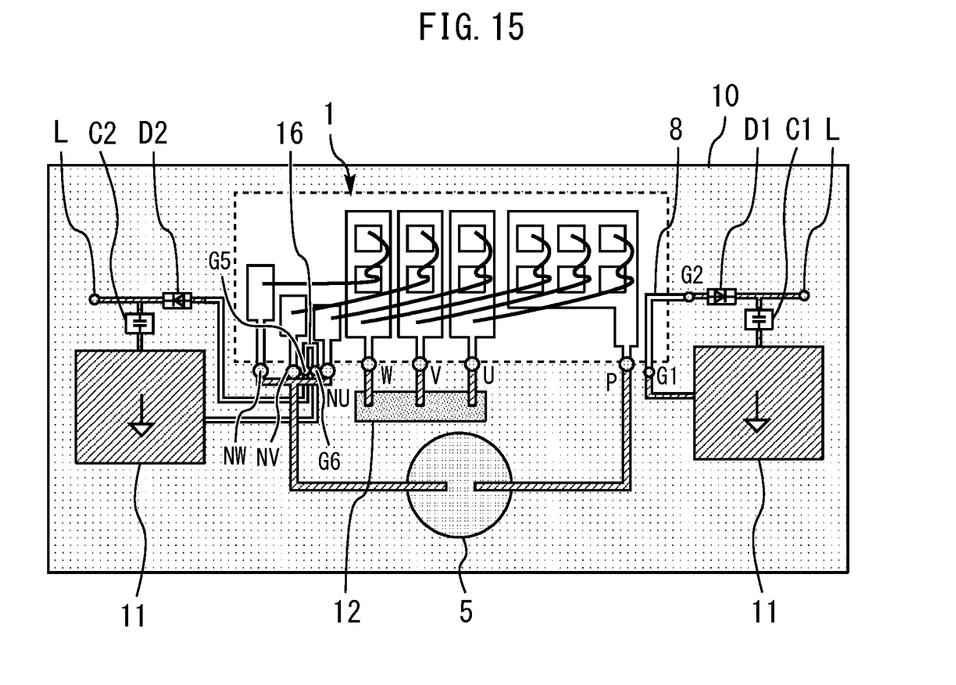
FIG. 15 is a diagram illustrating a modification of the semiconductor device according to the seventh embodiment.

FIG. 15 is a diagram illustrating a modification of the semiconductor device according to the seventh embodiment. The wiring 16 is positioned in a U shape between the NV terminal and the NU terminal. In this case as well, the effects in the seventh embodiment can be obtained. Note that the wiring 16 may be positioned on the left side of the NW terminal. In this case, the wiring 16 does not need to be positioned in the U shape and is positioned in an L shape like the wiring 8.

Eighth Embodiment

Figure 16:
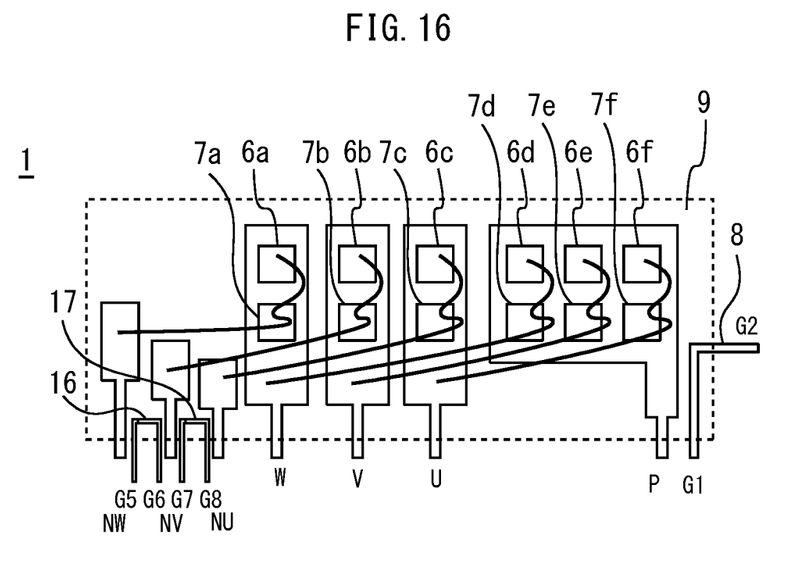
FIG. 16 is a diagram illustrating a semiconductor module according to an eighth embodiment.

FIG. 16 is a diagram illustrating a semiconductor module according to an eighth embodiment. Not only the wiring 16 but also a wiring 17 is positioned in a U shape between the NV terminal and the NU terminal. Both of an end portion G7 and an end portion G8 of the wiring 17 are exposed from the sealing material 9. The wiring 17 generates an induced electromotive force according to a change in an electric current flowing in the NV terminal and the NU terminal. Like the wirings 8 and 16, one end of the wiring 17 is connected to a GND electrode 11 and the other end of the wiring 17 is connected to a diode. Consequently, it is possible to generate induced electromotive forces from two places on the N terminal side. The other components and effects are the same as the components and the effects in the seventh embodiment.

As explained above, the wiring that generates an induced electromotive force is positioned adjacent to the P terminal in the first embodiment and is positioned adjacent to the NW terminal, the NV terminal, or the NU terminal in the seventh and eighth embodiments. That is, the wiring is positioned adjacent to a positive electrode terminal or a negative electrode terminal of a semiconductor module. Not only this, but the wiring may be positioned adjacent to a U terminal, a V terminal, or a W terminal that output a three-phase sine wave modulation current.

The switching devices 6a to 6f and the diodes 7a to 7f are not limited to devices formed of silicon, but instead may be formed of a wide-bandgap semiconductor having a bandgap wider than that of silicon. The wide-bandgap semiconductor is, for example, a silicon carbide, a gallium-nitride-based material, or diamond.

A device formed of the wide bandgap semiconductor is capable of performing high-speed switching. Accordingly, even if mutual inductance is the same, a temporal change in a magnetic flux is large and an electromotive force to be induced is high. Therefore, compared with when a low-speed switching device formed of silicon is used, the lengths of the wirings 8, 16, and 17 can be reduced. It is possible to reduce the semiconductor module in size.

A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved. Both of the switching devices 6a to 6f and the diodes 7a to 7f are desirably formed of a wide-bandgap semiconductor. However, only one of them may be formed of a wide-bandgap semiconductor. Also in this case, the advantageous effects described in this embodiment can be obtained.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-117289, filed on Jul. 15, 2021 including specification, claims, drawings and summary, on which the convention priority of the present application is based, is incorporated herein by reference in its entirety.

The invention claimed is:

1. A semiconductor device comprising:
 a semiconductor module including a switching device, a first wiring connected to the switching device, a second wiring positioned adjacent to the first wiring and generating induced electromotive force according to a change in an electric current flowing in the first wiring, and a sealing material sealing the switching device, the first wiring and the second wiring, wherein both of one end and the other end of the second wiring are exposed from the sealing material;
 a substrate including a GND electrode connected to the one end and on which the semiconductor module is mounted; and
 a diode rectifying the induced electromotive force output from the other end.

2. The semiconductor device according to claim 1, wherein the first wiring is a positive electrode terminal or a negative electrode terminal of the semiconductor module.

3. The semiconductor device according to claim 1, wherein the second wiring includes two or more wirings having different distances from the first wiring.

4. The semiconductor device according to claim 1, wherein the second wiring includes an inductor.

5. The semiconductor device according to claim 1, further comprising a capacitor accumulating output power of the diode.

6. The semiconductor device according to claim 1, further comprising a rechargeable battery charging output power of the diode.

7. The semiconductor device according to claim 1, wherein the diode is provided on an inside of the semiconductor module.

8. The semiconductor device according to claim 5, wherein the GND electrode is a GND electrode on a control side to which the capacitor is connected.

9. The semiconductor device according to claim 1, wherein the GND electrode is a GND electrode on a power side to which a negative electrode terminal of the semiconductor module is connected.

10. The semiconductor device according to claim 1, wherein the switching device is formed of a wide-band-gap semiconductor.

* * * * *